(12) United States Patent
Choi et al.

(10) Patent No.: US 10,400,331 B2
(45) Date of Patent: Sep. 3, 2019

(54) METHOD FOR MANUFACTURING METAL CHALCOGENIDE THIN FILM AND THIN FILM MANUFACTURED THEREBY

(71) Applicants: LG ELECTRONICS INC., Seoul (KR); RESEARCH & BUSINESS FOUNDATION SUNGKYUNKWAN UNIVERSITY, Suwon-si, Gyeonggi-do (KR)

(72) Inventors: Minseok Choi, Seoul (KR); Changgu Lee, Suwon-si (KR); Youngchan Kim, Suwon-si (KR)

(73) Assignees: LG ELECTRONICS INC., Seoul (KR); RESEARCH & BUSINESS FOUNDATION SUNGKYUNKWAN UNIVERSITY, Suwon-si, Gyeonggi-do (KR)

( * ) Notice: Subject to any disclaimer, the term of this patent is extended or adjusted under 35 U.S.C. 154(b) by 0 days.

(21) Appl. No.: 15/120,238

(22) PCT Filed: Feb. 10, 2015

(86) PCT No.: PCT/KR2015/001328
§ 371 (c)(1),
(2) Date: Aug. 19, 2016

(87) PCT Pub. No.: WO2015/126087
PCT Pub. Date: Aug. 27, 2015

(65) Prior Publication Data
US 2017/0073809 A1   Mar. 16, 2017

(30) Foreign Application Priority Data
Feb. 21, 2014 (KR) .................. 10-2014-0020276

(51) Int. Cl.
*C23C 16/30* (2006.01)
*C23C 14/00* (2006.01)
(Continued)

(52) U.S. Cl.
CPC ........ *C23C 16/305* (2013.01); *C23C 14/0021* (2013.01); *C23C 14/0623* (2013.01); *C23C 14/228* (2013.01); *C23C 16/46* (2013.01)

(58) Field of Classification Search
CPC ... C23C 16/305; C23C 16/46; C23C 14/0623; C23C 14/228
See application file for complete search history.

(56) References Cited

U.S. PATENT DOCUMENTS

2005/0079284 A1* 4/2005 Ivkovich, Jr. ....... C23C 14/0005
427/162
2006/0043354 A1* 3/2006 Pinnow ............... C23C 14/0623
257/2
(Continued)

FOREIGN PATENT DOCUMENTS

KR   10-2010-0080939 A   7/2010
KR   10-2012-0102067 A   9/2012
(Continued)

OTHER PUBLICATIONS

Gong et al., "Band Gap Engineering and Layer-by-Layer Mapping of Selenium-Doped Molybdenum Disulfide," Nano Letters, vol. 14, Dec. 24, 2013, pp. A-H (pp. 442-449).
(Continued)

*Primary Examiner* — Joseph A Miller, Jr.
(74) *Attorney, Agent, or Firm* — Birch, Stewart, Kolasch & Birch, LLP (57) ABSTRACT

The present invention relates to the manufacturing of a heteroelement thin film, and particularly to a method for manufacturing a metal chalcogenide thin film and the thin
(Continued)

film manufactured thereby. The present invention, which relates to a method for manufacturing a metal chalcogenide thin film, may comprise the steps of: supplying a vaporized metal precursor; supplying a chalcogen-containing gas; and forming a thin film by reacting the metal precursor with the chalcogen-containing gas on a growth substrate at a first temperature condition.

7 Claims, 11 Drawing Sheets

(51) Int. Cl.
C23C 14/06 (2006.01)
C23C 14/22 (2006.01)
C23C 16/46 (2006.01)

(56) References Cited

U.S. PATENT DOCUMENTS

| | | |
|---|---|---|
| 2010/0314599 A1 | 12/2010 | Kikuchi et al. |
| 2011/0100460 A1 | 5/2011 | Bryden et al. |
| 2012/0171378 A1 | 7/2012 | Xiao et al. |
| 2013/0105824 A1* | 5/2013 | Paranjape ............ H01L 31/032 257/86 |
| 2013/0267082 A1 | 10/2013 | Gatineau et al. |
| 2014/0027775 A1* | 1/2014 | Quick ................... C23C 16/305 257/53 |
| 2015/0118487 A1* | 4/2015 | Wolden ................. C01G 49/12 428/336 |

FOREIGN PATENT DOCUMENTS

| | | |
|---|---|---|
| KR | 10-2012-0123126 A | 11/2012 |
| KR | 10-2012-0137296 A | 12/2012 |
| KR | 10-2013-0103913 A | 9/2013 |

OTHER PUBLICATIONS

Ji et al., "Epitaxial Monolayer $MoS_2$ on Mica with Novel Photoluminescence," Nano Letters, vol. 13, Jul. 30, 2013, pp. 3870-3877.

Wang et al., "Controlled Synthesis of Highly Crystalline $MoS_2$ Flakes by Chemical Vapor Deposition," Journal of the American Chemical Society, vol. 135, Mar. 14, 2013, pp. 5304-5307.

* cited by examiner

METHOD FOR MANUFACTURING METAL CHALCOGENIDE THIN FILM AND THIN FILM MANUFACTURED THEREBY

CROSS REFERENCE TO RELATED APPLICATIONS

This application is the National Phase of PCT International Application No. PCT/KR2015/001328, filed on Feb. 10, 2015, which claims priority under 35 U.S.C. 119(a) to Patent Application No. 10-2014-0020276, filed in Feb. 21, 2014, which is hereby expressly incorporated by reference into the present application.

TECHNICAL FIELD

The present invention relates to manufacture of a heteroelement thin film, and particularly to a method of manufacturing a metal chalcogenide thin film and a thin film manufactured by the method.

BACKGROUND ART

Among elements which belong to the group 16 of the periodic table, five elements including oxygen (O), sulfur (S), selenium (Se), tellurium (Te) and polonium (Po) are referred to as oxygen group elements and, of five, only three elements of sulfur, selenium and tellurium are referred to as sulfur group elements or chalcogens.

Oxygen and sulfur are representative non-metal elements, whereas other metals lose non-metallic properties and increase in metallic properties as atomic number increases. Selenium, tellurium and polonium are rare elements, whereas polonium is a naturally radioactive element.

Metal chalcogenide is a compound of a transition metal and chalcogen, which is a nano material having a similar structure to graphene. Metal chalcogenide has a very small thickness corresponding to a thickness of an atomic scale layer, is thus soft and transparent and has electrical properties such as semiconductor and conductor properties.

In particular, metal chalcogenide having semiconductor properties has a suitable band gap and electron mobility of hundreds of $cm^2/V \cdot s$, thus being applicable to semiconductor devices such as transistors and having great potential as elastic transistor devices.

$MoS_2$, $WS_2$ and the like, which are metal chalcogenide materials on which the most active research is conducted, are capable of efficiently absorbing light due to direct band gap under a single layer condition and is thus suitable for application to optical devices such as optical sensors and solar cells.

A method of producing a metal chalcogenide nano thin film has been actively researched. However, there is a need for requirements of metal chalcogenide thin films for application to the devices, that is, methods of uniformly and continuously synthesizing large-area thin films.

SUMMARY OF THE INVENTION

An object of the present invention devised to solve the problem lies in a method of uniformly manufacturing a metal chalcogenide thin film with a large area and high quality and a thin film manufactured by the method.

The object of the present invention can be achieved by providing a method of manufacturing a metal chalcogenide thin film including supplying a gasified metal precursor, supplying a chalcogen-containing gas, and reacting the metal precursor with the chalcogen-containing gas on a growth substrate under a first temperature condition to form a thin film.

Here, the method may further include conducting heat treatment under a second temperature condition higher than the first temperature condition.

In this case, the first temperature condition may be 300 to 850° C., and the second temperature condition may be 850 to 1,200° C.

In addition, the formation or heat treatment of the thin film may be carried out under an argon gas atmosphere.

Here, the gasified metal precursor may be formed by heating a metal powder.

In this case, the metal powder may include metal oxide including at least one of $MoO_3$, $MoO$, $MoO_2$, $WO_2$, $WO_3$, $VO$, $VO_2$, $V_2O_3$, $V_2O_5$, $V_3O_5$, $NbO$, $NbO_2$, $Nb_2O_5$, $TaO$, $TaO_2$, $Ta_2O_5$, $TiO$, $TiO_2$, $Ti_2O_3$, $Ti_3O_5$, $ZrO_2$, $HfO_2$, $TcO_2$, $Tc_2O_7$, $ReO_2$, $ReO_3$, $Re_2O_3$, $Re_2O_7$, $CoO$, $Co_2O_3$, $Co_3O_4$, $Rh_2O_3$, $RhO_2$, $IrO_2$, $Ir_2O_3$, $IrO_2.2H_2O$, $NiO$, $Ni_2O_3$, $PdO$, $PdO_2$, $PtO$, $PtO_2$, $PtO_3$, $Pt_3O_4$, $PtO_2.H_2O$, $GaO$, $Ga_2O$, $Ga_2O_3$, $SnO$, and $SnO_2$, metal halide including at least one of $MoF_3$, $MoF_6$, $MoF_4$, $Mo_4F_{20}$, $MoCl_2$, $MoCl_3$, $MoCl_6$, $MoCl_4$, $MoCl_5$, $MoBr_3$, $MoBr_4$, $MoI_2$, $MoI_3$, $MoI_4$, $WF_6$, $WF_4$, $[WF_5]_4$, $WCl_2$, $WCl_6$, $WCl_4$, $[WCl_5]_2$, $[W_6Cl_{12}]Cl_6$, $WBr_3$, $WBr_6$, $WBr_4$, $WBr_5$, $W_6Br_{14}$, $WI_2$, $WI_3$, $WI_4$, $VF_2$, $VF_3$, $VF_4$, $VF_5$, $VCl_2$, $VCl_3$, $VCl_4$, $VBr_2$, $VBr_3$, $VBr_4$, $VI_2$, $VI_3$, $VI_4$, $NbCl_3$, $NbCl_4$, $NbCl_5$, $NbBr_4$, $NbBr_5$, $NbI_3$, $NbI_4$, $NbI_5$, $TaF_3$, $[TaF_5]_4$, $TaCl_3$, $TaCl_4$, $TaCl_5$, $TaBr_3$, $TaBr_4$, $TaBr_5$, $TaI_4$, $TaI_5$, $TiF_2$, $TiF_3$, $TiF_4$, $TiCl_4$, $TiCl_3$, $TiCl_2$, $TiBr_3$, $TiBr_4$, $HfCl_4$, $HfBr_2$, $HfBr_4$, $HfI_3$, $HfI_4$, $ZrF_4$, $ZrCl_2$, $ZrCl_3$, $ZrCl_4$, $ZrBr_3$, $ZrBr_4$, $ZrI_2$, $ZrI_3$, $ZrI_4$, $TcF_6$, $TcF_5$, $TcCl_4$, $TcCl_6$, $TcBr_4$, $ReF_6$, $ReF_4$, $ReF_5$, $ReF_7$, $Re_3Cl_9$, $ReCl_5$, $ReCl_4$, $ReCl_6$, $ReBr_3$, $ReBr_4$, $ReBr_5$, $ReI_3$, $ReI_4$, $CoF_2$, $CoF_3$, $CoF_4$, $CoCl_2$, $CoCl_3$, $CoBr_2$, $CoI$, $RhF_3$, $RhF_6$, $RhF_4$, $[RhF_5]_4$, $RhCl_3$, $RhBr_3$, $RhI_3$, $IrF_3$, $IrF_6$, $ZrF_4$, $[IrF_5]_4$, $IrCl_2$, $IrCl_3$, $IrCl_4$, $IrBr_2$, $ZrBr_3$, $ZrBr_4$, $IrI_2$, $IrI_3$, $IrI_4$, $NiF_2$, $NiCl_2$, $NiBr_2$, $NiI$, $PdF_2$, $PdF_4$, $PdCl_2$, $PdBr_2$, $PdI_2$, $PtF_6$, $PtF_4$, $[PtF_5]_4$, $PtCl_2$, $PtCl_3$, $PtCl_4$, $Pt_6Cl_{12}$, $PtBr_2$, $PtBr_3$, $PtBr_4$, $PtI_2$, $PtI_3$, $PtI_4$, $GaF_3$, $GaCl_2$, $GaCl_3$, $GaBr_3$, $GaI_3$, $SnF_2$, $SnF_4$, $SnCl_2$, $SnCl_4$, $SnBr_2$, $SnBr_4$, $SnI_2$, and $SnI_4$, or metal carbonyl including at least one of $Mo(CO)_6$, $W(CO)_6$, $Nb(CO)_6$, $V(CO)_6$, $Ta(CO)_6$, $Ti(CO)_6$, $Zr(CO)_7$, $Tc_2(CO)_{10}$, $Hf(CO)_7Re_2(CO)_{10}$, $Co_2(CO)_8$, $Co_4(CO)_{12}$, $Co_6(CO)_{16}$, $Rh_2(CO)_8$, $Rh_4(CO)_{12}$, $Rh_6(CO)_{16}$, $Ir_2(CO)_8$, $Ir_4(CO)_{12}$, $Ir_6(CO)_{16}$, $Ni(CO)_4$, $Pd(CO)_4$, and $Pt(CO)_4$.

Here, the formation of the thin film may include forming a thin film of at least one of $MoS_2$, $MoSe_2$, $MoTe_2$, $WS_2$, $WSe_2$, $WTe_2$, $NbS_2$, $NbSe_2$, $NbTe_2$, $TaS_2$, $TaSe_2$, $TaTe_2$, $ZrS_2$, $ZrSe_2$, $ZrTe_2$, $HfS_2$, $HfSe_2$, $TcS_2$, $ReS_2$, $ReTe_2$, $CoS$, $CoS_2$, $CoSe_2$, $CoTe$, $RhS_2$, $RhSe_2$, $RhTe_2$, $IrS_2$, $IrSe_2$, $IrTe_3$, $NiS$, $NiSe$, $NiTe$, $PdS_2$, $PdSe$, $PdSe_2$, $PdTe$, $PdTe_2$, $PtS$, $PtS_2$, $PtSe_2$, $PtTe$, $PtTe_2$, $GaS$, $Ga_2S_3$, $GaSe$, $Ga_2Se_3$, $Ga_2Te_3$, $SnS_2$, $SnS$, $SnSe_2$, $SnSe$, and $SnTe$.

Here, the chalcogen-containing gas may include at least one of $S_2$, $Se_2$, $Te_2$, $H_2S$, $H_2Se$, and $H_2Te$.

Here, the growth substrate may include at least one of Si, $SiO_2$, BN, Ge, GaN, AlN, GaP, InP, GaAs, SiC, $Al_2O_3$, $LiAlO_3$, MgO, glass, quartz, sapphire, graphite, and graphene.

Here, the formation of the thin film may include forming a compound or mixture of at least two types of metal chalcogenides.

Here, the method may further include transferring the formed thin film to a final substrate.

In this case, the growth substrate may include a substrate including $SiO_2$ disposed on Si.

In another aspect of the present invention, provided herein is a metal chalcogenide thin film manufactured by the method described above.

In yet another aspect of the present invention, provided herein is a method of manufacturing a metal chalcogenide thin film including disposing a growth substrate in a chamber and heating the growth substrate to a thin film growth temperature, supplying a gasified metal precursor and a chalcogen-containing gas to the chamber, reacting the gasified metal precursor with the chalcogen-containing gas on the growth substrate to form a thin film, and conducting heat treatment at a temperature higher than the growth temperature.

First, because a metal chalcogenide thin film is formed by vapor reaction and a gas chalcogen source is used, a high-quality thin film can be obtained and large-area uniform thin film synthesis is possible.

Metal chalcogenide material groups can be grown to a thickness which is stepwise controlled from a single layer to a multiple layer by chemical vapor deposition and can be variably used according to application.

The synthesized metal chalcogenide thin film can be detached from a growth substrate and then transferred to any substrate and is variably applicable to channel layers, sensors and the like, of field effect transistors (FETs).

DETAILED DESCRIPTION OF THE EMBODIMENTS

Reference will now be made in detail to the preferred embodiments of the present invention, examples of which are illustrated in the accompanying drawings.

However, the present invention allows various modifications and variations and specific embodiments thereof are exemplified with reference to the drawings and will be described in detail. The present invention should not be construed as limited to the embodiments set forth herein and includes modifications, equivalents and substitutions compliant with the spirit or scope of the present invention defined by the appended claims.

It will be understood that when an element such as a layer, area or substrate is referred to as being "on" another element, it may be directly on the element, or one or more intervening elements may also be present therebetween.

In addition, it will be understood that although terms such as "first" and "second" may be used herein to describe elements, components, areas, layers and/or regions, the elements, components, areas, layers and/or regions should not be limited by these terms.

In addition, it is not deemed that steps described in the present invention should be conducted in order. For example, terms such as a first step and a second step do not mean that the first step should be conducted before the second step.

Figure 1:
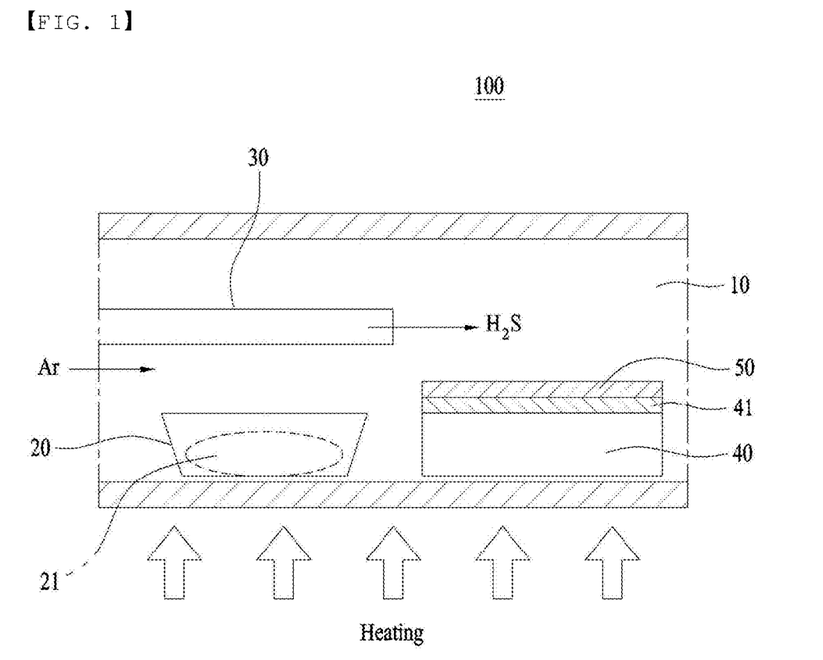
FIG. 1 is a schematic view illustrating an example of a process of manufacturing a metal chalcogenide thin film according to the present invention.

FIG. 1 is a schematic view illustrating an example of a process of manufacturing a metal chalcogenide thin film according to the present invention.

As shown in FIG. 1, a gasified metal precursor reacts with a chalcogen-containing gas using a growth apparatus 100 and is subjected to vapor deposition to form a metal chalcogenide thin film.

The process of forming the metal chalcogenide thin film may include supplying a gasified metal precursor, supplying a chalcogen-containing gas and reacting the gasified metal precursor with the chalcogen-containing gas on a growth substrate under a first temperature condition to form a thin film. These steps may be performed in different orders or simultaneously.

FIG. 1 schematically illustrates a process of growing a metal chalcogenide thin film using chemical vapor deposition (CVD) for growth of a thin film. This case shows an example in which hydrogen sulfide ($H_2S$) gas is used as the chalcogen-containing gas and molybdenum oxide ($MoO_3$) is used as a metal precursor.

A metal chalcogenide thin film including a single or multiple layer structure can be formed from the gasified metal precursor ($MoO_3$) and the chalcogen-containing gas ($H_2S$) using this growth apparatus according to reaction temperature and/or content ratios.

The gasified metal precursor can be produced by heating a molybdenum oxide ($MoO_3$) powder 21 in a boat 20. That is, a gasified radical is formed by heating the metal powder 21, which can be moved to a growth area by a carrier gas. In this case, the carrier gas may be selected from a variety of gases and is for example an argon gas (Ar). That is, growth of the thin film may be conducted under an argon gas atmosphere.

In addition, the chalcogen-containing gas ($H_2S$) may be supplied from an additional tube 30. An apparatus for supplying this gas may be included. In addition to the components shown in FIG. 1, components such as a mass flow controller (MFC), a furnace, a pump and a controller may be further included.

The growth substrate 40 may be a silicon (Si) substrate 40 and a metal chalcogenide thin film 50 may be formed on the silicon (Si) substrate 40. In this case, silicon oxide ($SiO_2$) 41 may be disposed on the silicon substrate 40. That is, silicon oxide 41 may be disposed between the silicon substrate 40 and the metal chalcogenide thin film 50.

The growth substrate 40 may include, in addition to a silicon substrate, at least one of $SiO_2$, BN, Ge, GaN, AlN, GaP, InP, GaAs, SiC, $Al_2O_3$, $LiAlO_3$, MgO, glass, quartz, sapphire, graphite and graphene.

In this case, a thin film growth area in the chamber 10 may be heated under suitable growth conditions using an additional heater (not shown). At least one of the chamber 10 and the tube 30 may include quartz.

As described above, an example in which the metal powder 21 includes molybdenum oxide ($MoO_3$) is shown, and the metal powder 21 may include at least one of metal oxides such as MoO, $MoO_2$, $WO_2$, $WO_3$, VO, $VO_2$, $V_2O_3$, $V_2O_5$, $V_3O_5$, NbO, $NbO_2$, $Nb_2O_5$, TaO, $TaO_2$, $Ta_2O_5$, TiO, $TiO_2$, $Ti_2O_3$, $Ti_3O_5$, $ZrO_2$, $HfO_2$, $TcO_2$, $Tc_2O_7$, $ReO_2$, $ReO_3$, $Re_2O_3$, $Re_2O_7$, CoO, $Co_2O_3$, $Co_3O_4$, $Rh_2O_3$, $RhO_2$, $IrO_2$, $Ir_2O_3$, $IrO_2.2H_2O$, NiO, $Ni_2O_3$, PdO, $PdO_2$, PtO, $PtO_2$, $PtO_3$, $Pt_3O_4$, $PtO_2.H_2O$, GaO, $Ga_2O$, $Ga_2O_3$, SnO, and $SnO_2$.

In addition, the metal powder 21 may include at least one of metal halides such as $MoF_3$, $MoF_6$, $MoF_4$, $Mo_4F_{20}$, $MoCl_2$, $MoCl_3$, $MoCl_6$, $MoCl_4$, $MoCl_5$, $MoBr_3$, $MoBr_4$, $MoI_2$, $MoI_3$, $MoI_4$, $WF_6$, $WF_4$, $[WF_5]_4$, $WCl_2$, $WCl_6$, $WCl_4$, $[WCl_5]_2$, $[W_6Cl_{12}]Cl_6$, $WBr_3$, $WBr_6$, $WBr_4$, $WBr_5$, $W_6Br_{14}$, $WI_2$, $WI_3$, $WI_4$, $VF_2$, $VF_3$, $VF_4$, $VF_5$, $VCl_2$, $VCl_3$, $VCl_4$, $VBr_2$, $VBr_3$, $VBr_4$, $VI_2$, $VI_3$, $VI_4$, $NbCl_3$, $NbCl_4$, $NbCl_5$, $NbBr_4$, $NbBr_5$, $NbI_3$, $NbI_4$, $NbI_5$, $TaF_3$, $[TaF_5]_4$, $TaCl_3$, $TaCl_4$, $TaCl_5$, $TaBr_3$, $TaBr_4$, $TaBr_5$, $TaI_4$, $TaI_5$, $TiF_2$, $TiF_3$, $TiF_4$, $TiCl_4$, $TiCl_3$, $TiCl_2$, $TiBr_3$, $TiBr_4$, $HfCl_4$, $HfBr_2$, $HfBr_4$, $HfI_3$, $HfI_4$, $ZrF_4$, $ZrCl_2$, $ZrCl_3$, $ZrCl_4$, $ZrBr_3$, $ZrBr_4$, $ZrI_2$, $ZrI_3$, $ZrI_4$, $TcF_6$, $TcF_5$, $TcCl_4$, $TcCl_6$, $TcBr_4$, $ReF_6$, $ReF_4$, $ReF_5$, $ReF_7$, $Re_3Cl_9$, $ReCl_5$, $ReCl_4$, $ReCl_6$, $ReBr_3$, $ReBr_4$, $ReBr_5$, $ReI_3$, $ReI_4$, $CoF_2$, $CoF_3$, $CoF_4$, $CoCl_2$, $CoCl_3$, $CoBr_2$, $CoI_2$, $RhF_3$, $RhF_6$, $RhF_4$, $[RhF_5]_4$, $RhCl_3$, $RhBr_3$, $RhI_3$, $IrF_3$, $IrF_6$, $IrF_4$, $[IrF_5]_4$, $IrCl_2$, $IrCl_3$, $IrCl_4$, $IrBr_2$, $IrBr_3$, $IrBr_4$, $IrI_2$, $IrI_3$, $IrI_4$, $NiF_2$, $NiCl_2$, $NiBr_2$, $NiI_2$, $PdF_2$, $PdF_4$, $PdCl_2$, $PdBr_2$, $PdI_2$, $PtF_6$, $PtF_4$, $[PtF_5]_4$, $PtCl_2$, $PtCl_3$, $PtCl_4$, $Pt_6Cl_{12}$, $PtBr_2$, $PtBr_3$, $PtBr_4$, $PtI_2$, $PtI_3$, $PtI_4$, $GaF_3$, $GaCl_2$, $GaCl_3$, $GaBr_3$, $GaI_a$, $SnF_2$, $SnF_4$, $SnCl_2$, $SnCl_4$, $SnBr_2$, $SnBr_4$, $SnI_2$, and $SnI_4$.

In addition, the metal powder 21 may include at least one of metal carbonyls such as $Mo(CO)_6$, $W(CO)_6$, $Nb(CO)_6$, $V(CO)_6$, $Ta(CO)_6$, $Ti(CO)_6$, $Zr(CO)_7$, $Tc_2(CO)_{10}$, $Hf(CO)_7Re_2(CO)_{10}$, $Co_2(CO)_8$, $Co_4(CO)_{12}$, $Co_6(CO)_{16}$, $Rh_2(CO)_8$, $Rh_4(CO)_{12}$, $Rh_6(CO)_{16}$, $Ir_2(CO)_8$, $Ir_4(CO)_{12}$, $Ir_6(CO)_{16}$, $Ni(CO)_4$, $Pd(CO)_4$, and $Pt(CO)_4$.

Meanwhile, as described above, an example in which hydrogen sulfide ($H_2S$) is used as the chalcogen-containing gas has been shown, but at least one gas of $S_2$, $Se_2$, $Te_e$, $H_2Se$, and $H_2Te$ may be used.

A thin film of at least one of $MoS_2$, $MoSe_2$, $MoTe_2$, $WS_2$, $WSe_2$, $WTe_2$, $NbS_2$, $NbSe_2$, $NbTe_2$, $TaS_2$, $TaSe_2$, $TaTe_2$, $ZrS_2$, $ZrSe_2$, $ZrTe_2$, $HfS_2$, $HfSe_2$, $TcS_2$, $ReS_2$, $ReTe_2$, CoS, $CoS_2$, $CoSe_2$, CoTe, $RhS_2$, $RhSe_2$, $RhTe_2$, $IrS_2$, $IrSe_2$, $IrTe_3$, NiS, NiSe, NiTe, PdS, PdSe, $PdSe_2$, PdTe, $PdTe_2$, PtS, $PtS_2$, $PtSe_2$, PtTe, $PtTe_2$, GaS, $Ga_2S_3$, GaSe, $Ga_2Se_3$, $Ga_2Te_3$, $SnS_2$, SnS, $SnSe_2$, SnSe and SnTe can be formed using the metal powder 21 and the chalcogen-containing gas.

Upon formation of the thin film, gasification of the metal powder 21 may be carried out at 300 to 1,000° C. In addition, synthesis of the metal chalcogenide thin film 50 may be carried out at 300 to 1,000 C.°. More specifically, synthesis of the metal chalcogenide thin film 50 may be carried out at 300 to 850° C.

Molybdenum oxide ($MoO_3$) has a melting point of about 795° C., whereas growth of the thin film is carried out at a temperature lower than the melting point. For example, growth of a molybdenum sulfide ($MoS_2$) thin film from hydrogen sulfide ($H_2S$) as a chalcogen-containing gas and molybdenum oxide may be carried out at 600° C.

In the case of using plasma enhanced CVD (PECVD) or the like, a temperature of gasifying the metal powder 21 and a temperature of synthesizing the metal chalcogenide thin film 50 may be lowered to 100° C.

Figure 2:
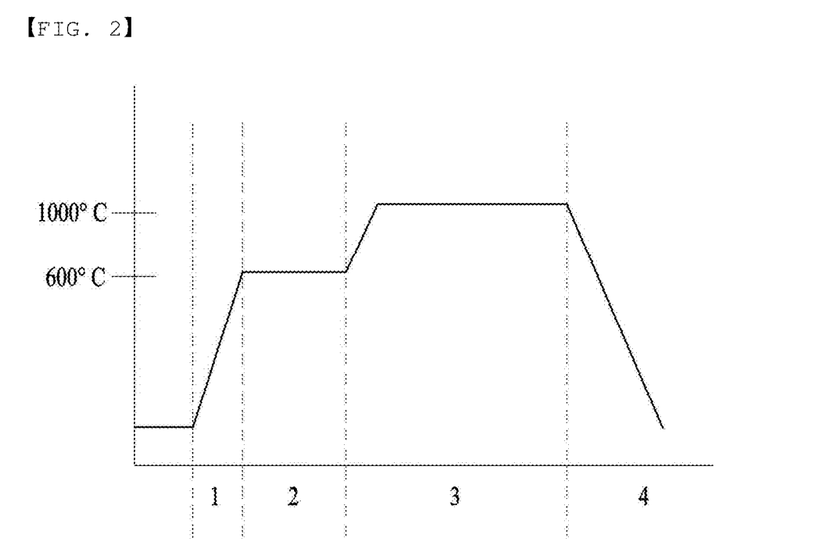
FIG. 2 is a graph showing an example of a process of forming a metal chalcogenide thin film according to the present invention.

FIG. 2 is a graph showing an example of a process of forming a metal chalcogenide thin film according to the present invention.

As shown in FIG. 2, for example, the process of forming the metal chalcogenide thin film may include four steps.

First, heating 1 may be conducted. Such heating 1 may increase an inner temperature of the chamber 10.

Then, a chalcogen-containing gas is supplied at a growth temperature (for example, 600° C.) to grow a metal chalcogenide thin film 50 (2).

Then, heat treatment is conducted at a temperature higher than the growth temperature (for example, 1,000° C.) (3). During this heat treatment, a chalcogen-containing gas may be supplied. Such heat treatment may be conducted at a temperature of 800 to 1,200° C.

Then, cooling (4) to lower a temperature may be conducted.

All of these steps may be conducted under an argon gas atmosphere.

During growth of the metal chalcogenide thin film 50, a compound or mixture of at least two types of metal chalcogenide thin films 50 may be formed. That is, a plurality of different metal chalcogenide thin films 50, or a compound or mixture thereof may be formed using at least two types of gasified metal precursors and chalcogen-containing gases.

When compounds or mixtures of at least two types of metal chalcogenide thin films 50 are formed, synthesis may be conducted sequentially or simultaneously. For example, during growth of the thin film (2), at least two types of metal chalcogenide thin films 50 may be sequentially formed, and heat treatment 3 may be conducted on the metal chalcogenide thin films 50 during or after formation of the metal chalcogenide thin films 50. Meanwhile, a series of steps of formation and heat treatment of one thin film may be repeated.

The method of forming the metal chalcogenide thin film 50 described above provides an effect of enabling uniform thin films with high quality as compared to the conventional method and enabling continuous formation of high-quality thin films with a large area. These effects will be described below.

Example 1

A molybdenum sulfide ($MoS_2$) thin film was formed as a metal chalcogenide thin film 50 using chemical vapor deposition (CVD) shown in FIG. 1.

The gasified metal precursor used herein was molybdenum oxide ($MoO_3$) and the chalcogen-containing gas used herein was hydrogen sulfide ($H_2S$). A molybdenum sulfide ($MoS_2$) thin film was formed by vapor reaction between the gasified metal precursor and the chalcogen-containing gas.

Figure 3:
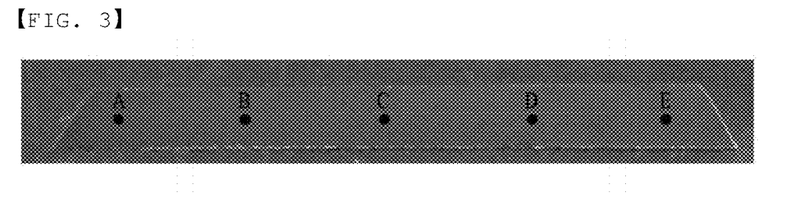
FIG. 3 is an image showing a metal chalcogenide thin film formed in Example 1 of the present invention.

FIG. 3 is an image showing a metal chalcogenide thin film formed in Example 1 of the present invention.

FIGS. 4 to 8 are optical microscope images at A to E points of FIG. 3. As shown in the drawings, a very uniform thin film is formed in each point (scratches shown in FIGS. 4 to 8 are purposely formed to confirm formation of the thin film).

The total length of the thin film formed in FIG. 3 was 10 cm and a uniform high-quality thin film was formed throughout the range. This shows that uniform growth of a thin film with a large area is possible.

Figure 4:
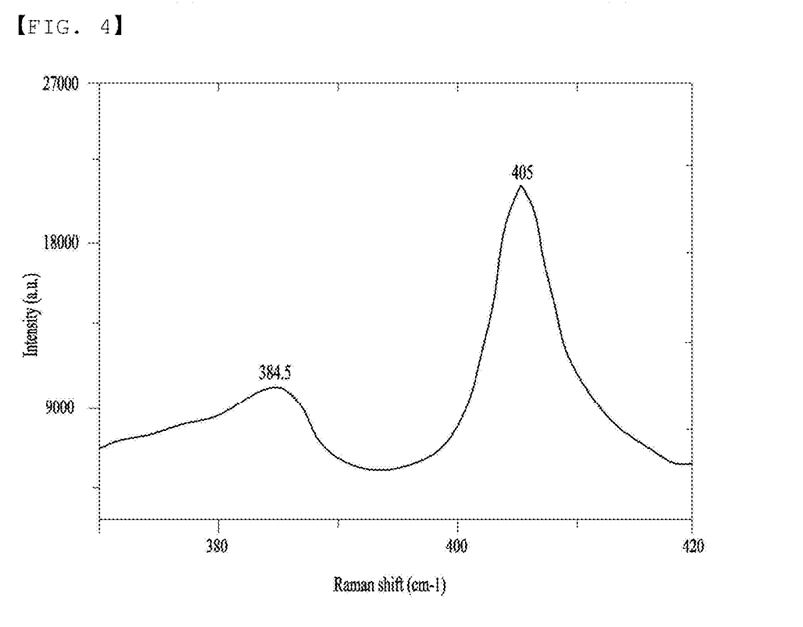
FIGS. 4 to 6 are Raman spectra at any point of FIG. 3.
Figure 5:
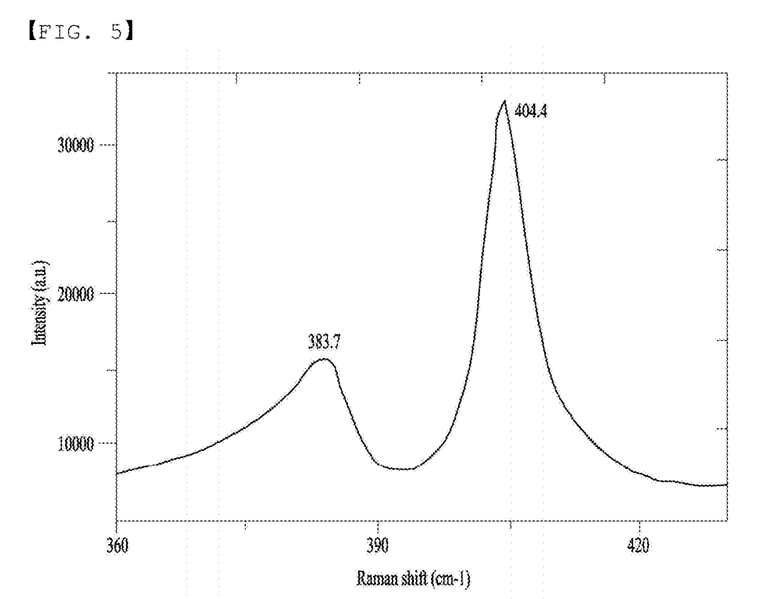
Figure 6:
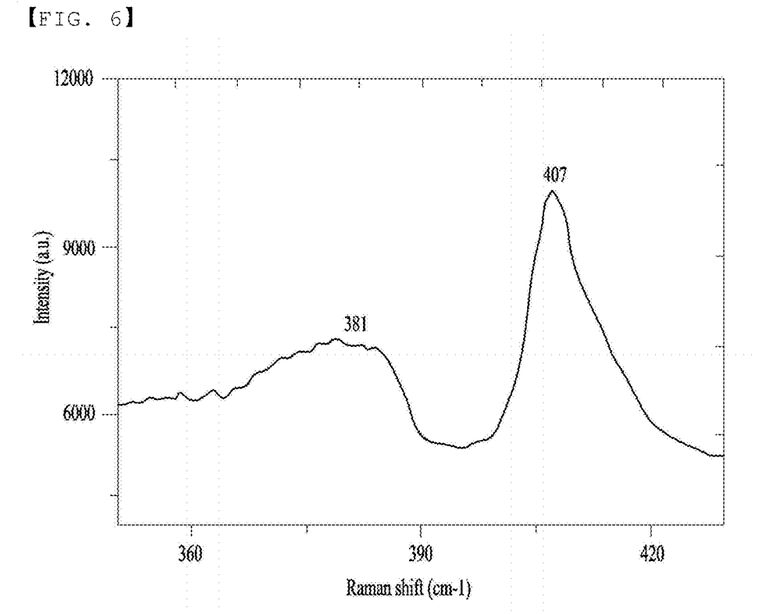

FIGS. 4 to 6 are Raman spectra of the thin film shown in FIG. 3 in an arbitrary point and the difference between two peaks is 21 cm$^{-1}$, which means that a uniform two-layered thin film is formed.

Figure 7:
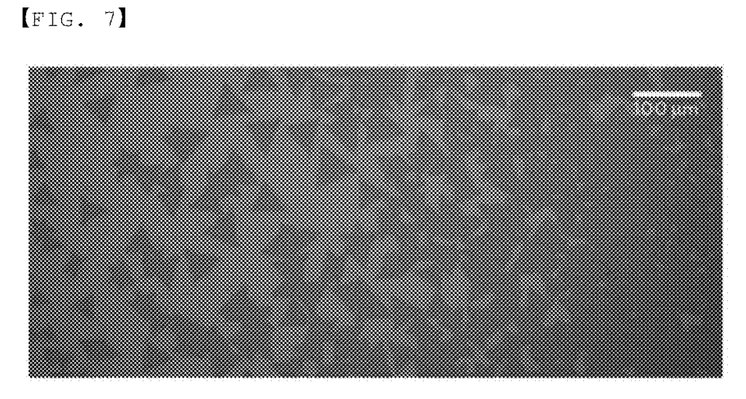
FIGS. 7 and 8 are images of molybdenum sulfide thin films formed using a conventional synthesis method.
Figure 8:
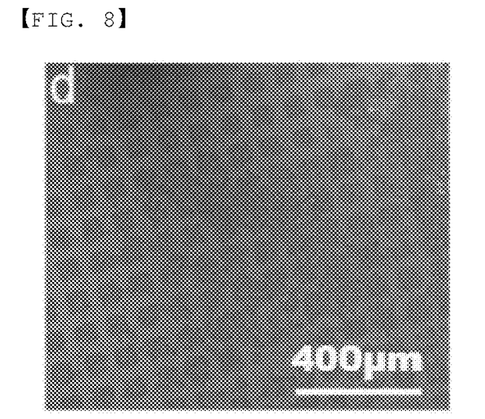

FIGS. 7 and 8 are images of a molybdenum sulfide thin film formed using a conventional synthesis method, which shows that the molybdenum sulfide thin film according to an embodiment of the present invention is a uniform high-quality thin film with a large area, as compared to a conventional synthesis thin film.

FIGS. 7 and 8 show a case in which a thin film is formed using a solid chalcogen source.

Example 2

A thin film was produced in the same manner as in Example 1 except that the thickness of the thin film was controlled by controlling the amount of gasified metal precursor and/or flow of the chalcogen-containing gas.

That is, the thickness of the molybdenum sulfide ($MoS_2$) thin film can be controlled by controlling the amount of molybdenum oxide ($MoO_3$) and/or flow of hydrogen sulfide ($H_2S$). The amount of molybdenum oxide ($MoO_3$) and/or flow of hydrogen sulfide ($H_2S$) used in the present example were less than those used in Example 1.

Figure 9:
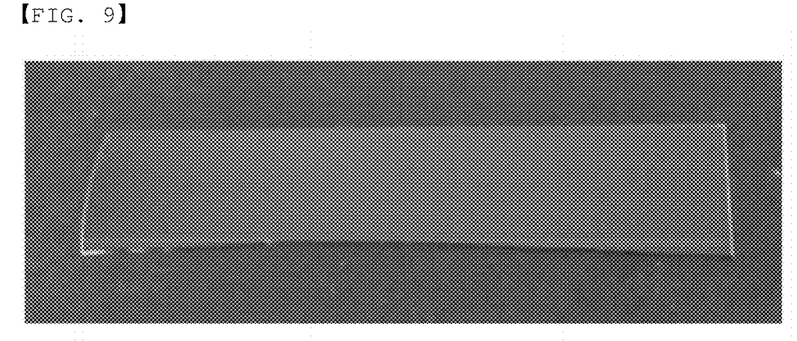
FIG. 9 is an image showing a metal chalcogenide thin film formed in Example 2 according to the present invention.
Figure 10:
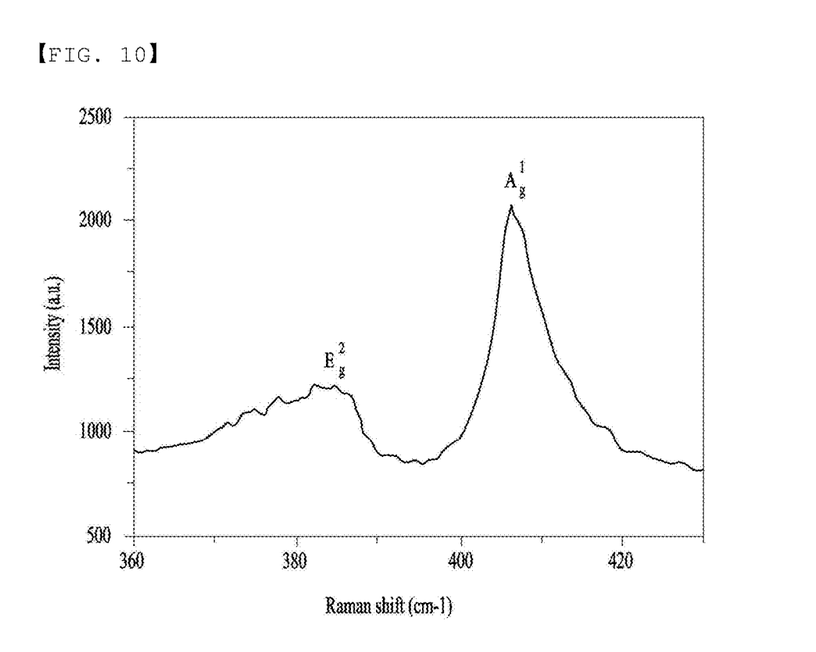
FIG. 10 is a Raman spectrum of a metal chalcogenide thin film formed in Example 2 of the present invention.

FIG. 9 is an image showing a metal chalcogenide thin film formed in Example 2 of the present invention. FIG. 10 is a Raman spectrum of a metal chalcogenide thin film formed in Example 2 of the present invention.

As can be seen from FIG. 19, a uniform high-quality thin film could be formed and, as can be seen from FIG. 10, molybdenum sulfide ($MoS_2$) is formed as a single layer.

A method of manufacturing a conventional metal chalcogenide thin film may be broadly divided into the following three steps.

1. Vapor deposition of solid metal source and solid chalcogen precursor
2. Formation of metal thin film by sulfuration
3. Formation of metal precursor thin film by sulfuration Other methods can be used, but representative methods are substantially within the scope of the aforementioned methods.

Using the first method, several tens to hundreds of micron-scale single crystal $MoS_2$ thin films can be obtained, but large-area continuous thin film synthesis is disadvantageously very difficult due to use of a solid metal source and a solid chalcogen source.

As an example of the second method, a molybdenum (Mo) thin film is deposited on a $SiO_2$/Si substrate and is sulfurated with $H_2S$ gas. When solid sulfur is heated, various sulfur chemicals such as $S_8$ are produced, which may cause defects of the $MoS_2$ thin film.

On the other hand, $H_2S$ used for thin film growth in the present invention is the most simple sulfur precursor, which reduces defects of a $MoS_2$ thin film because homogenous chemical species participate in the reaction.

As a representative example of the third synthesis method, a $MoO_3$ thin film is formed on a substrate and a $MoS_2$ thin film is synthesized by sulfuration.

However, a method capable of continuously and uniformly synthesizing a highly crystalline $MoS_2$ thin film in a large area has not been developed to date.

Like the second and third methods, first, when a metal or metal precursor thin film is formed and is then sulfurated, a large-area uniform thin film can be formed, whereas performance of the $MoS_2$ thin film is limited by crystallinity of the first formed thin film and formation of a highly crystalline $MoS_2$ thin film is difficult.

In accordance with the first method, a highly crystalline thin film can be formed, but $MoS_2$ is formed on only a part of the substrate using a solid source. Accordingly, large-area, uniform and continuous thin film synthesis is very difficult.

Comparative Example 1

As described above, a conventional method of forming a metal precursor thin film by sulfuration is known. In accordance with this method, a metal thin film is first formed and is then converted into a metal chalcogenide thin film by chemical reaction.

An example of this method is described in Korean Patent Laid-open Publication No. 2013-0103913 filed by the co-inventor with the present inventor.

In accordance with this method, a metal thin film is formed and reacts with a chalcogen atom-containing gas to form a metal chalcogenide thin film. In an example, a molybdenum (Mo) thin film is deposited on a $SiO_2$/Si substrate using an e-beam evaporator, is incorporated into a chemical vapor deposition apparatus, and reacted with hydrogen sulfide ($H_2S$) gas in the apparatus at 750° C. to form a molybdenum sulfide ($MoS_2$) thin film.

That is, a molybdenum (Mo) thin film is first formed and then reacts with hydrogen sulfide ($H_2S$) to form molybdenum sulfide ($MoS_2$).

In accordance with this method, a large-area uniform metal chalcogenide can be formed because the metal thin film is first formed and is then converted into a metal chalcogenide thin film by chemical reaction. However, the quality of the finally synthesized metal chalcogenide thin film may be limited by crystallinity of the initial metal thin film and formation of a highly crystalline metal chalcogenide thin film may be difficult because the metal chalcogenide thin film is formed by changing the structure of the previously formed thin film.

Figure 11:
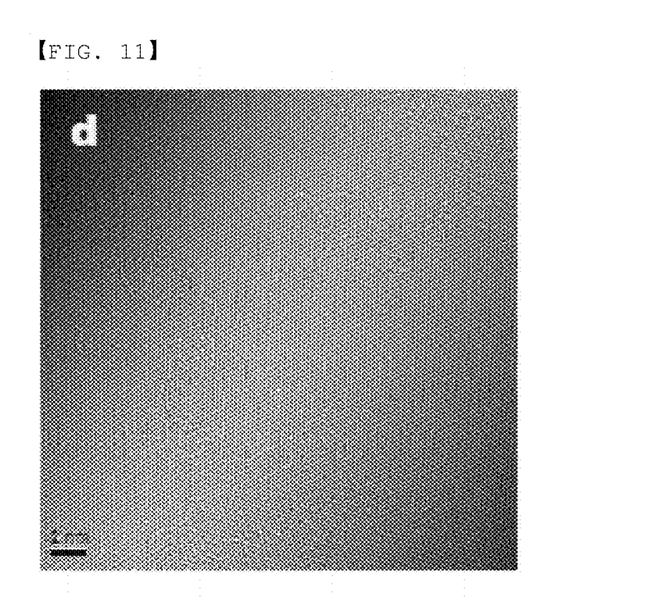
FIGS. 11 and 12 are TEM images of molybdenum sulfide thin films formed by an embodiment of the present invention
Figure 12:
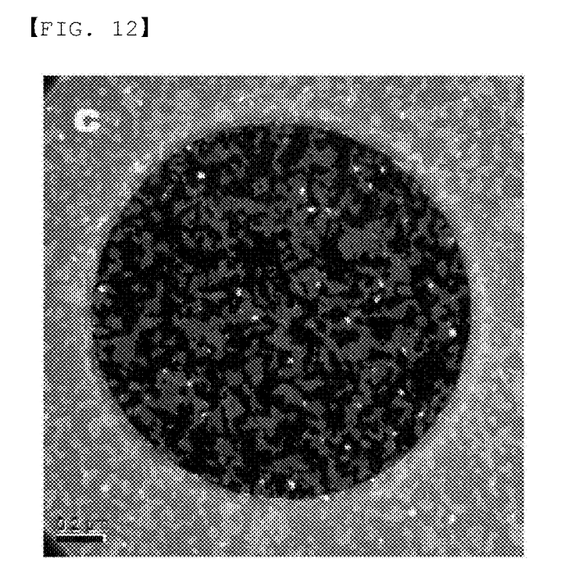
Figure 13:
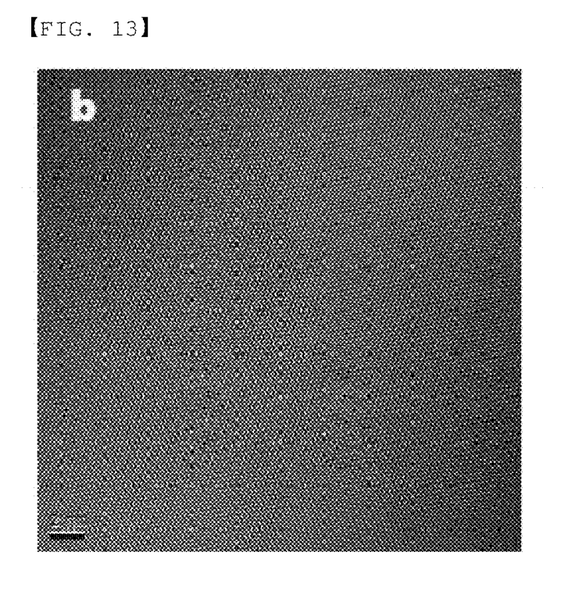
FIGS. 13 and 14 are TEM images of the molybdenum sulfide thin film formed by the conventional sulfuration described above.
Figure 14:
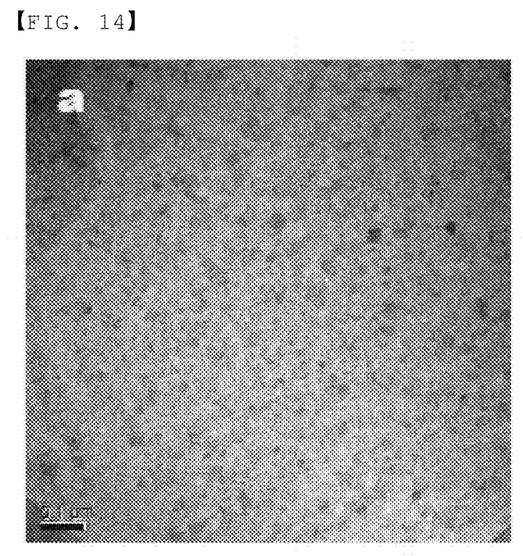

FIGS. 11 and 12 are TEM images of the molybdenum sulfide thin film formed by an embodiment of the present invention, and FIGS. 13 and 14 are TEM images of the molybdenum sulfide thin film formed by the conventional sulfuration described above.

Comparing FIG. 12 with FIG. 14, it can be seen that the $MoS_2$ thin film synthesized by the conventional method has a domain size of 10 to 20 nm. Meanwhile, the $MoS_2$ thin film synthesized according to the present invention has a domain size of 50 to 100 nm which is 5 times improved, as compared to that formed according to the conventional method. That is, it can be seen that an area where high-quality single crystals are formed is greatly widened.

Comparing FIG. 11 with FIG. 13, the $MoS_2$ thin film synthesized by the conventional method often has randomly arranged interlayer grids and thus Moiré patterns, whereas the $MoS_2$ thin film formed by the embodiment of the present invention has uniformly arranged $MoS_2$ interlayer grids and thus has no Moiré patterns.

That is, the molybdenum sulfide thin film formed by an embodiment of the present invention has 5 times greater domain size, suitably arranged interlayer grids, and thus excellent crystallinity, as compared to conventional methods.

Example 3/Comparative Example 2

As described above, the present invention uses vapor reaction of a metal precursor with a gas chalcogen precursor, thereby obtaining a MoS$_2$ thin film with a large domain, as compared to a conventional method using chalcogenization of the metal thin film. Accordingly, the synthesized MoS$_2$ thin film can exhibit improved device performance.

For example, a field effect transistor (FET) produced using the thin film produced according to the present invention has greatly improved electron mobility.

Figure 15:
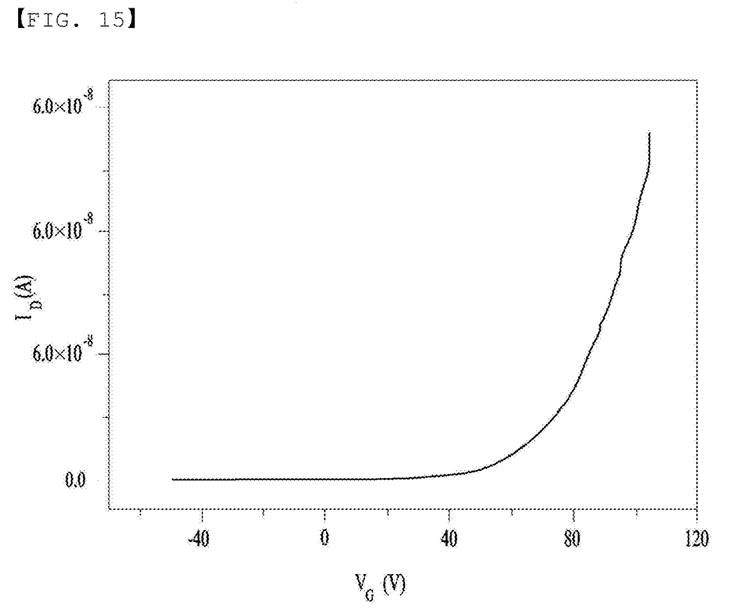
FIG. 15 is a graph showing characteristics of an FET device produced using a $MoS_2$ thin film formed according to the present invention.

FIG. 15 shows characteristics of an FET device produced using a MoS$_2$ thin film formed according to the present invention.

Figure 16:
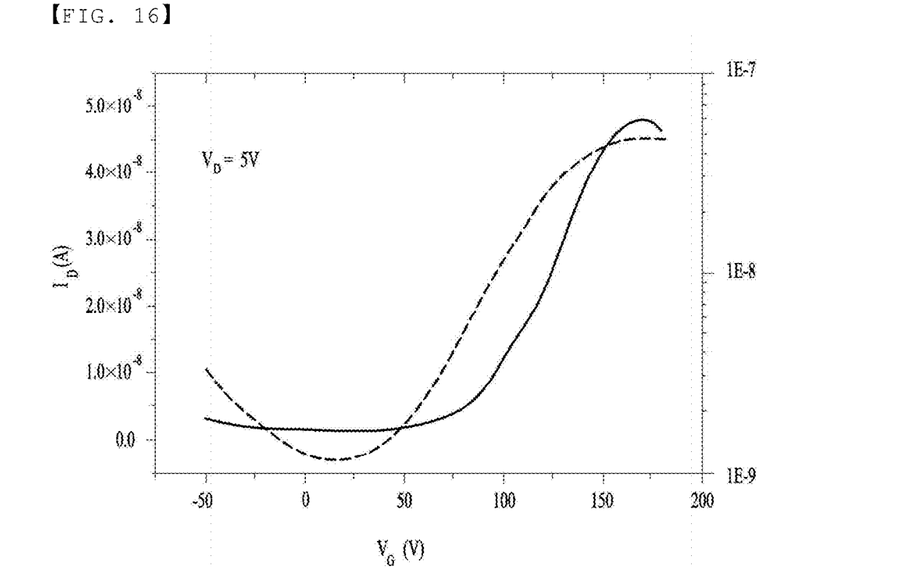
FIG. 16 is a graph showing characteristics of an FET device produced using a $MoS_2$ thin film formed according to the conventional method.

Meanwhile, FIG. 16, which is Comparative Example 2, shows characteristics of an FET device produced using a MoS$_2$ thin film formed according to the conventional method as described above.

Figure 17:
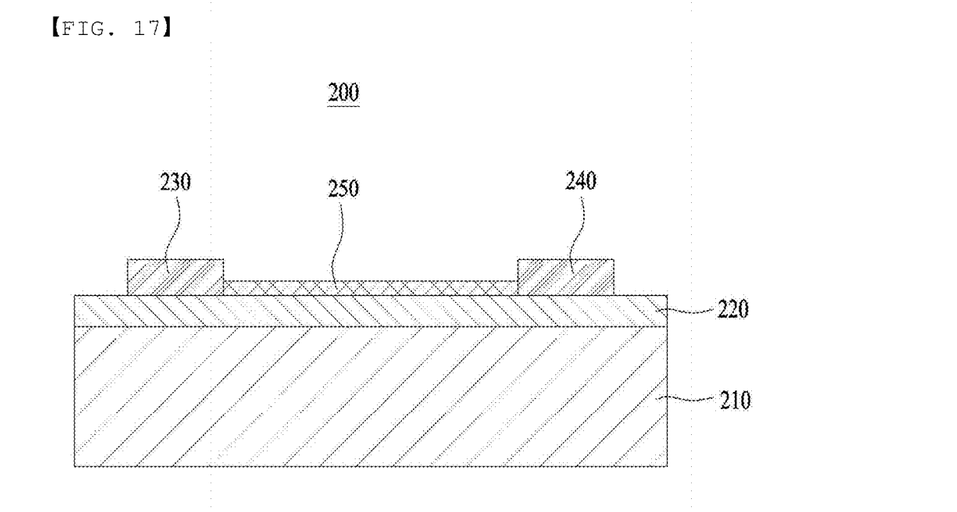
FIG. 17 is a sectional view illustrating an example of a thin film transistor with a back-gate structure.

The FET device may have the same structure as in FIG. 17. That is, in the FET device 200, the MoS$_2$ thin film may be used as a channel layer 250. In addition, the FET device 200 has a back-gate structure in which a silicon gate 210 is disposed in a lower part and a silicon oxide layer 220 is disposed on the gate 210.

Source and drain electrodes 230 and 240 are spaced from each other on the silicon oxide layer 220 and a channel layer 250 including a MoS$_2$ thin film is disposed between the two electrodes 230 and 240.

Mobility and on-off ratio measured using such a device structure in the case of the present invention are greatly improved as compared to a conventional method.

That is, in the present invention, mobility is $7\times10^{-2}$ cm$^2$/V·s and on-off ratio is about $10^5$. On the other hand, in the conventional method, mobility is $6.4\times10^{-4}$ cm$^2$/V·s and on-off ratio is about $10^2$.

As such, the mobility is about 100 times improved and on-off ratio is 103 times improved, as compared to the conventional method.

On-off ratio means a value obtained by dividing a source-drain current in an on-state of an FET into a source-drain current in an off-state of FET.

In a digital circuit, FET may serve as a switch which blocks or allows for a current between the source and the drain. Accordingly, as on/off ratio increases, the FET can serve as an excellent switch device. When the on-off ratio increases, in an off-state, leak current is small and more accurate resulting values can be obtained in the production of logic circuits.

Figure 18:
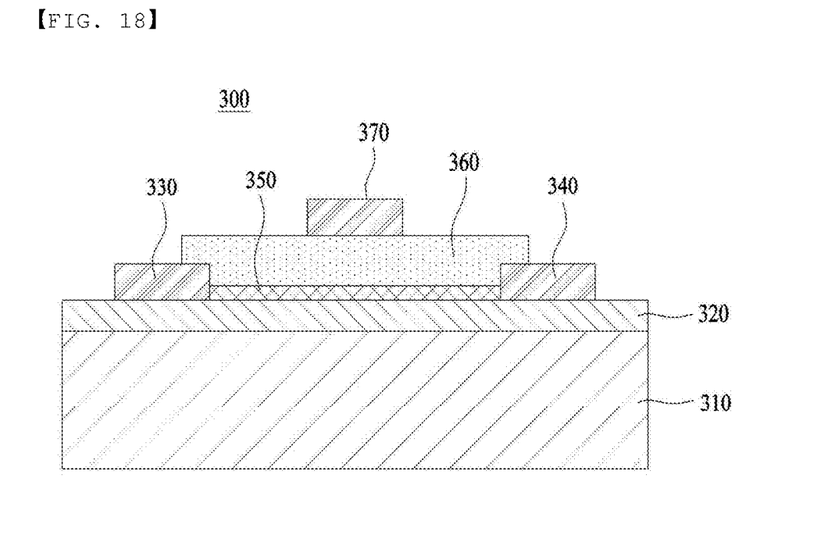
FIG. 18 is a sectional view illustrating an example of a thin film transistor with a top-gate structure.

Meanwhile, in a case in which a top-gate FET shown in FIG. 18 is produced as the FET device, greater performance can be obtained.

In the FET device 300 of FIG. 18, a silicon layer 310 disposed in a lower part may be used as a substrate. Like the FET device of FIG. 17, the FET device of FIG. 18 has a structure in which a silicon oxide layer 320 is disposed on the silicon layer 310, the source electrode 330 and the drain electrode 340 are spaced from each other, and a channel layer 350 including a MoS$_2$ thin film is interposed between the two electrodes 330 and 340.

However, a dielectric layer 360 is disposed on the source electrode 330, the drain electrode 340 and the channel layer 350, and a gate electrode 370 is disposed on the dielectric layer 360.

The dielectric layer 360 may be produced using a high-k dielectric such as HfO$_2$ and Al$_2$O$_3$. In this case, performance can be improved 30 to 100 times. This is because a dielectric layer 360 having a high-k dielectric constant offsets charge trapping at the interface of the MoS$_2$ thin film.

In addition, in the case of such an electronic device, when MoS$_2$ thin films used as channel layers 250 and 350 are produced as a multilayer structure, performance including mobility can be further improved.

The metal chalcogenide thin film has electrical properties such as semiconductor and superconductor properties, thus being applicable to a variety of fields including optical sensors, gas sensors, bio-sensors, field effect transistors (FETs), solar cells, display devices, flexible devices, optical catalysts, tunneling transistors spintronic devices and valleytronic devices.

FIGS. 19 to 22 are sectional views illustrating a process of transferring the metal chalcogenide thin film according to the present invention to the final substrate.

As shown in FIGS. 19 to 22, the metal chalcogenide thin film formed by the embodiment of the present invention can be transferred to a final substrate 70.

For example, as shown in FIG. 1, the metal chalcogenide thin film 50 provided on the substrate 40 and the silicon oxide 41 may be transferred to a variety of substrates including the substrate 70, which is then used.

The final substrate 70 may be a transparent or non-transparent substrate which is directly applicable to various electronic devices and elements, and may be selected from a variety of substrates including a semiconductor wafer, plastic, glass and an elastic substrate.

Figure 19:
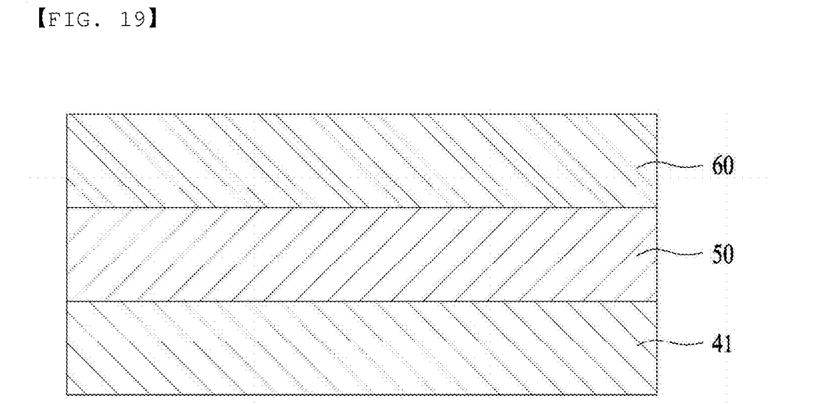
FIGS. 19 to 22 are sectional views illustrating a process of transferring the metal chalcogenide thin film to a final substrate.

For this purpose, as shown in FIG. 19, first, a support substrate 60 may be formed on or adhered to a metal chalcogenide thin film 50. The support substrate 60 may be adhered using a release tape such as a heat release tape or optical release tape. In some cases, a resin such as PMMA, PDMS or PVA may be adhered or directly applied to the metal chalcogenide thin film 50.

Figure 20:
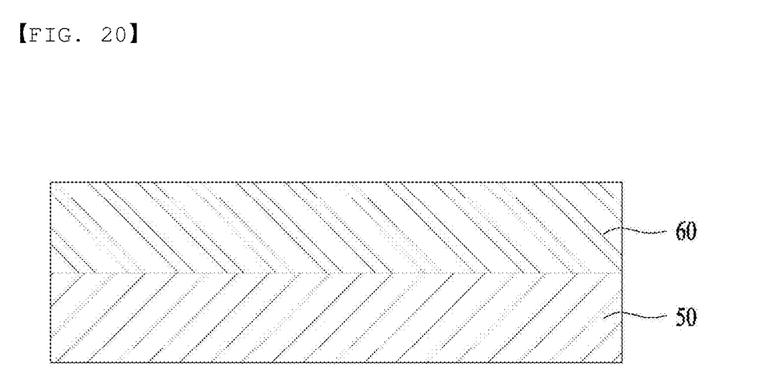

Next, as shown in FIG. 20, the silicon oxide 41 may be removed by a method such as etching.

Figure 21:
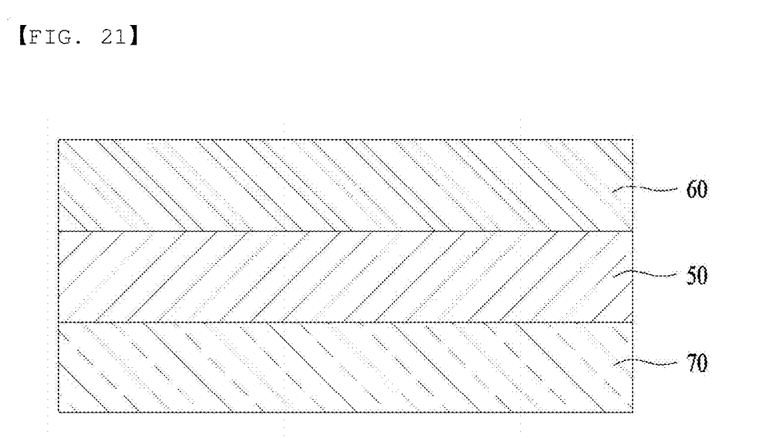

Then, as shown in FIG. 21, the metal chalcogenide thin film 50 adhered to the support substrate 60 may be adhered to the final substrate 70.

Figure 22:
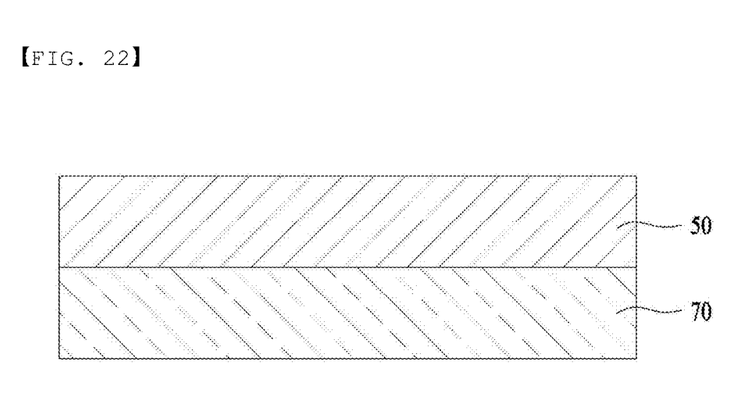

Then, the support substrate 60 is separated or removed so that the metal chalcogenide thin film 50 can be disposed on the final substrate 70, as shown in FIG. 22.

As described above, because a metal chalcogenide thin film is formed by vapor reaction and a gas chalcogen source is used, a high-quality thin film can be obtained and large-area uniform thin film synthesis is possible.

Metal chalcogenide material groups can be grown to a thickness stepwise controlled from a single layer to multiple layers using chemical vapor deposition and can be variably used according to application.

The synthesized metal chalcogenide thin film can be detached from the growth substrate and then transferred to any substrate and is variably applicable to channel layers, sensors and the like, of field effect transistors (FETs).

Meanwhile, although embodiments according to the present invention disclosed in the specification and the drawings have been provided as specific examples for illustrative purposes, they should not be construed as limiting the scope of the present invention. It will be apparent to those skilled in the art that various modifications and variations can be made in the present invention without departing from the spirit or scope of the invention.

According to the present invention, the synthesized metal chalcogenide thin film can be detached from the growth substrate and then transferred to any substrate, and is variably applicable to channel layers, sensors and the like, of field effect transistors (FETs).

The invention claimed is:

1. A method of manufacturing a metal chalcogenide thin film comprising:
   supplying a gasified metal precursor by heating $MoO_3$ powder;
   supplying a chalcogen-containing gas including $H_2S$;
   reacting the metal precursor with the chalcogen-containing gas on a growth substrate under a first temperature condition to form an $MoS_2$ thin film;
   conducting a heat treatment under a second temperature condition higher than the first temperature condition;
   cooling to lower a temperature; and
   transferring the formed $MoS_2$ thin film to a final substrate,
   wherein the growth substrate comprises a substrate including $SiO_2$ disposed on Si, and reacting the metal precursor with the chalcogen-containing gas is performed such that the metal chalcogenide thin film is directly formed on the substrate including $SiO_2$ disposed on Si,
   wherein reacting the metal precursor with the chalcogen-containing gas is carried out at a temperature lower than a melting point of metal of the metal precursor,
   wherein the second temperature condition is 850 to 1,200° C.,
   wherein manufacturing the $MoS_2$ thin film is carried out using a plasma enhanced chemical vapor deposition (CVD) method,
   wherein the first temperature is 100° C. or lower, and
   wherein the $MoS_2$ thin film has a domain size of 50 to 100 nm.

2. The method according to claim 1, wherein the formation or heat treatment of the $MoS_2$ thin film is carried out under an argon gas atmosphere.

3. The method according to claim 1, wherein the formation of the $MoS_2$ thin film comprises forming a compound or mixture of at least two types of metal chalcogenides.

4. The method according to claim 1, wherein the chalcogen-containing gas is supplied from a tube.

5. The method according to claim 1, wherein transferring the formed $MoS_2$ thin film to the final substrate includes:
   forming or attaching a support substrate on a first surface of the $MoS_2$ thin film;
   removing the $SiO_2$;
   attaching the final substrate to a second surface of the $MoS_2$ thin film; and
   separating or removing the support substrate.

6. The method according to claim 5, wherein the support substrate includes a resin including PMMA, PDMS or PVA.

7. The method according to claim 5, wherein the support substrate is adhered using a release tape including a heat release tape or an optical release tape.

* * * * *